United States Patent
Cho et al.

(10) Patent No.: US 8,952,738 B1
(45) Date of Patent: Feb. 10, 2015

(54) SLEW RATE CONTROL DEVICE USING SWITCHING CAPACITOR

(71) Applicant: Soongsil University Research Consortium Techno-Park, Seoul (KR)

(72) Inventors: Seong Woong Cho, Seoul (KR); Hoo Young Shin, Incheon (KR); Chang Kun Park, Gyeonggi-do (KR)

(73) Assignee: Soongsil University Research Consortium Techno-Park, Seoul (KR)

( * ) Notice: Subject to any disclaimer, the term of this patent is extended or adjusted under 35 U.S.C. 154(b) by 0 days.

(21) Appl. No.: 14/445,083

(22) Filed: Jul. 29, 2014

(30) Foreign Application Priority Data

Aug. 5, 2013 (KR) .......................... 10-2013-0092749

(51) Int. Cl.
*H03K 5/12* (2006.01)
*H03K 5/04* (2006.01)

(52) U.S. Cl.
CPC ........................................ *H03K 5/04* (2013.01)
USPC ......................................................... 327/170

(58) Field of Classification Search
USPC ......................................................... 327/170
See application file for complete search history.

(56) References Cited

U.S. PATENT DOCUMENTS

| 5,041,738 A | * | 8/1991 | Walters, Jr. ................... 327/130 |
| 5,079,453 A | * | 1/1992 | Tisinger et al. ............... 327/132 |
| 5,132,553 A | * | 7/1992 | Siegel .......................... 327/109 |
| 2013/0135985 A1 | * | 5/2013 | Friedmann et al. ........... 370/216 |

FOREIGN PATENT DOCUMENTS

KR  10-2001-0073701 A  8/2001

* cited by examiner

*Primary Examiner* — Adam Houston
(74) *Attorney, Agent, or Firm* — Revolution IP, PLLC (57) ABSTRACT

Disclosed is a slew rate control device using a switching capacitor which includes a first capacitor that is connected to a target circuit operated in response to a clock signal, and controls a rising slope of a signal output from the target circuit when the clock signal is in a high state; a switch that is connected to the first capacitor in parallel, receives a reverse signal of the clock signal, as a control signal, and is turned on when the clock signal is in a low state; and a second capacitor that is connected to the switch in series, and controls a falling slope of the signal output from the target circuit when the clock signal is in the low state.

8 Claims, 9 Drawing Sheets

SLEW RATE CONTROL DEVICE USING SWITCHING CAPACITOR

CROSS-REFERENCE TO RELATED APPLICATIONS

This application claims the priority of Korean Patent Application No. 10-2013-0092749 filed on Aug. 5, 2013, in the Korean Intellectual Property Office, the disclosure of which is incorporated herein by reference.

BACKGROUND OF THE INVENTION

1. Field of the Invention

The present invention relates to a slew rate control device using a switching capacitor, and more particularly, to a slew rate control device using a switching capacitor with which it is possible to control rising and falling slew rates by turning on and off a signal in an amplitude shift keying process.

2. Description of the Related Art

In general, a slew rate means the amount of change in rising and falling of an output per unit time with respect to a step change of a control input signal. The slew rate has a characteristic that sensitively responds to influence of an external environment or a temperature.

Figure 1:
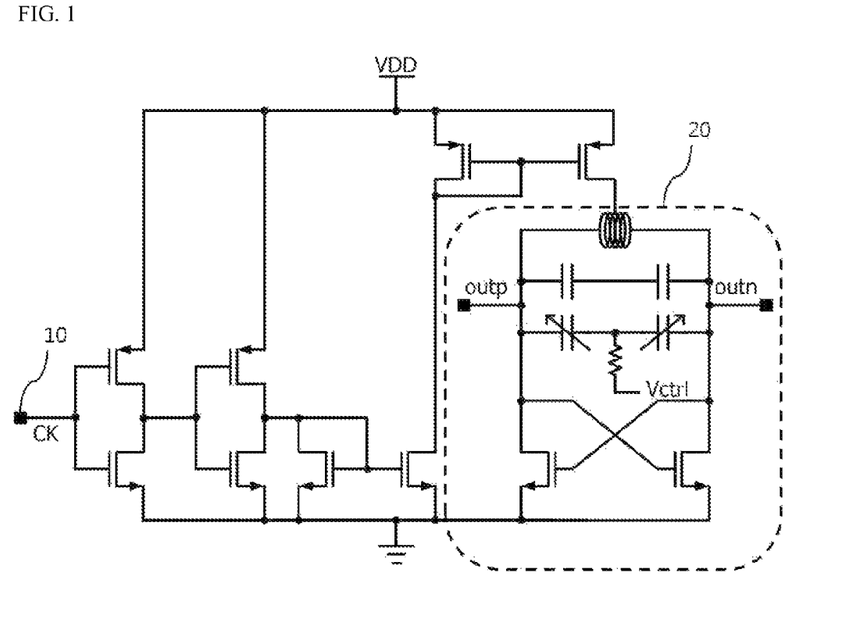
FIG. 1 is a circuit diagram of a voltage controlled oscillator according to the related art.

FIG. 1 is a circuit diagram of a voltage controlled oscillator according to the related art. In FIG. 1, a CK terminal 10 is a portion to which a digital pulse signal (hereinafter, referred to as a clock signal) for controlling an operation of a voltage controlled oscillator (VCO) 20 is input. The voltage controlled oscillator 20 performs modulation in an amplitude shift keying manner in response to an input of the digital pulse signal. That is, when a high signal is input to the CK terminal 10, the voltage controlled oscillator 20 is operated, and when a low signal is input to the CK terminal 10, the voltage controlled oscillator 20 is not operated.

Figure 2:
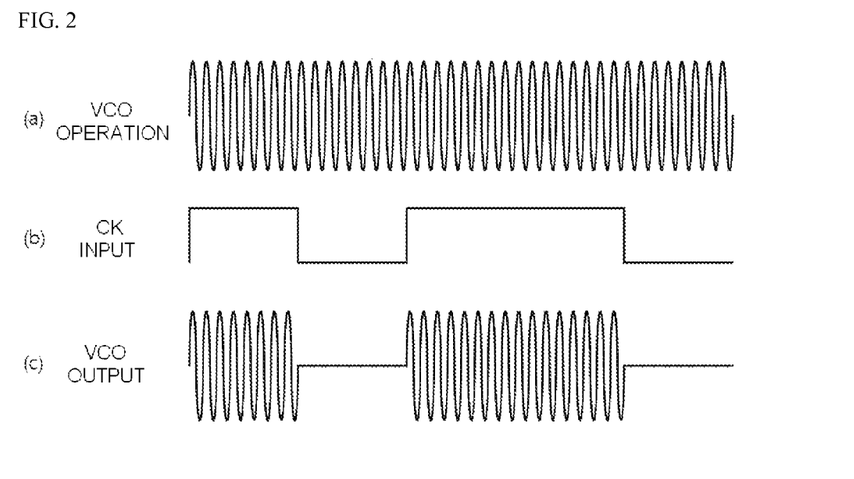
FIG. 2 is a diagram for describing an amplitude shift keying process of FIG. 1.

FIG. 2 is a diagram for describing an amplitude shift keying process of FIG. 1. (a) of FIG. 2 illustrates a general output waveform of the voltage controlled oscillator 20. (b) of FIG. 2 illustrates a waveform of the clock signal used to control driving of the voltage controlled oscillator 20.

(c) of FIG. 2 illustrates an output waveform of the voltage controlled oscillator 20 when the clock signal is applied, and it can be seen that the voltage controlled oscillator 20 is turned on or off depending on high and low states of the input clock signal. Here, a signal waveform of FIG. 2 corresponds to an ideal interpretation where a slew rate is not generated.

Figure 3:
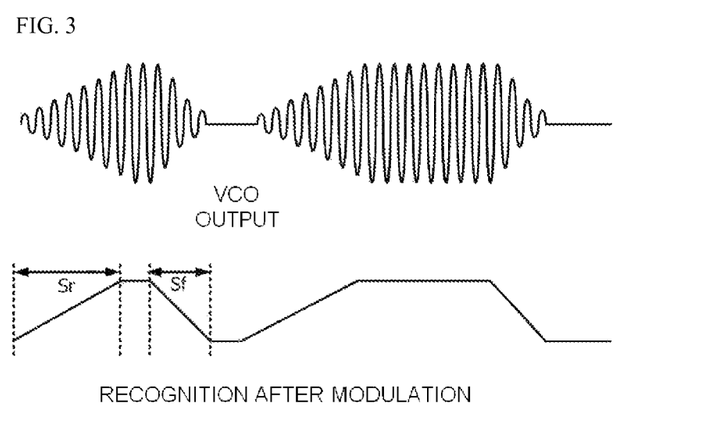
FIG. 3 illustrates a waveform in which a slew rate is generated when the circuit of FIG. 1 is driven.

FIG. 3 illustrates a waveform in which the slew rate is generated when the circuit of FIG. 1 is driven. Unlike an ideal amplitude shift keying result of (c) of FIG. 2, it can be seen from FIG. 3 that a rising slope Sr or a falling slope Sf is generated at the time when the clock signal is changed to a high state or a low state.

The slew rate is generated by a parasitic capacitor presented on the circuit of FIG. 1. Further, when the rising slope and the falling slope are not identical, quality of the signal may be degraded. In the related art, in order to solve an unbalance problem of the slew rate, an additional control circuit that controls the slew rate is needed, so that the circuit may be complicated due to the additional control circuit.

The background technology of the present invention is disclosed in Korean Patent Publication No. 2001-0073701 (published on Aug. 1, 2001).

SUMMARY OF THE INVENTION

An aspect of the present invention provides a slew rate control device using a switching capacitor with which it is possible to control a slew rate without an additional control circuit by simply a switching capacitor.

According to an aspect of the present invention, there is provided a slew rate control device using a switching capacitor including a first capacitor that is connected to a target circuit operated in response to a clock signal, and controls a rising slope of a signal output from the target circuit when the clock signal is in a high state; a switch that is connected to the first capacitor in parallel, receives a reverse signal of the clock signal, as a control signal, and is turned on when the clock signal is in a low state; and a second capacitor that is connected to the switch in series, and controls a falling slope of the signal output from the target circuit when the clock signal is in the low state.

Here, a contact point of the first capacitor and the switch may be connected to a power supply or a ground of the target circuit.

Further, the target circuit may be a voltage controlled oscillator or an amplifier.

Furthermore, capacitances of the first and second capacitors may be controlled such that the rising slope and the falling slope are equal.

Moreover, the slew rate control device using a switching capacitor may further include a sensing unit that detects the rising and falling slopes from the signal output from the target circuit; and a control unit that determines the capacitance of the first or second capacitor by using information detected by the sensing unit, and sends a capacitance control signal corresponding to the determined capacitance to the first or second capacitor.

Here, the first and second capacitors may be a variable capacitor including a varactor device.

In addition, the first and second capacitors may be respectively formed as capacitor banks including each including a capacitor group configured in such a manner that a plurality of capacitors having different capacitances is connected in parallel and a switch group configured in such a manner that a plurality of switches selectively switches one of the plurality of capacitors in response to the capacitance control signal.

Further, the first and second capacitors may be plural in number, the plurality of first and second capacitors may be paired with each other, and the plurality of paired first and second capacitors may be formed as a capacitor bank configured in such a manner that one pair of the plurality of pairs is selectively used in response to the capacitance control signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

As set forth above, according to exemplary embodiments of the invention, it is possible to easily design a circuit without requiring a complicated control circuit by simply a switching capacitor to a power supply node or a ground node of a target circuit to control a slew rate.

Exemplary embodiments of the present invention will be described in detail with reference to the accompanying drawings to allow those skilled in the art to easily implement the present invention.

The present invention relates to a slew rate control device using a switching capacitor, and the slew rate control device is connected to a power supply node or a ground node of a target circuit such as a voltage controlled oscillator or an amplifier to effectively control a rising slope and a falling slope generated in an output signal of the target circuit. Here, an operation of the target circuit may be controlled by a clock signal (a digital pulse signal), and may correspond to various circuits that use an amplitude shift keying modulation.

Figure 4:
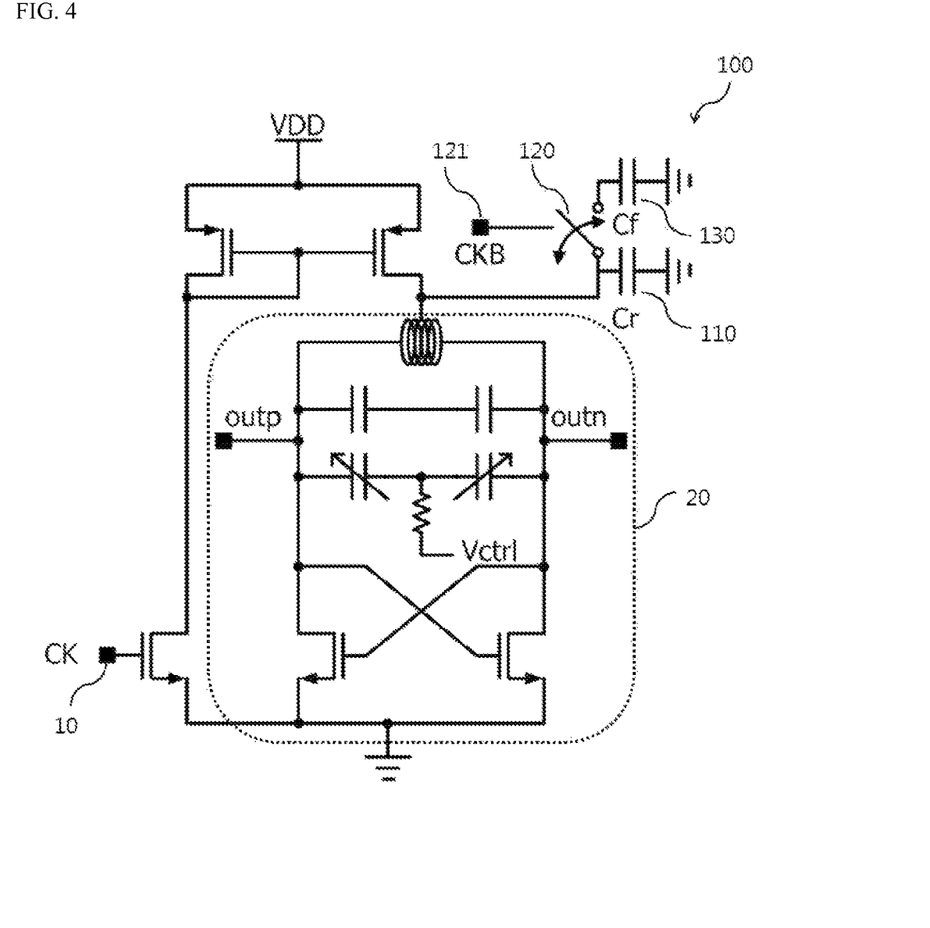
FIG. 4 is a configuration diagram of a slew rate control device using a switching capacitor according to an exemplary embodiment of the present invention.

FIG. 4 is a configuration diagram of a slew rate control device using a switching capacitor according to an exemplary embodiment of the present invention. FIG. 4 illustrates a case where the target circuit is a voltage controlled oscillator 20. Naturally, the present invention is not necessarily limited to this case.

A clock signal (a digital pulse signal) is input to a CK terminal 10 of FIG. 4, and the input clock signal is supplied to a VDD terminal of the voltage controlled oscillator 20 via an auxiliary circuit such as a transistor. When the clock signal input to the CK terminal 10 is in a high state, the voltage controlled oscillator 20 is turned on, and when the clock signal is in a low state, the voltage controlled oscillator is turned off.

FIG. 4 illustrates an example where a slew rate control device 100 is connected to a power supply node of the voltage controlled oscillator 20. Hereinafter, exemplary embodiments of the present invention will be described in detail based on the aforementioned disclosure.

The slew rate control device 100 according to the exemplary embodiment of the present invention includes a first capacitor 110, a switch 120, and a second capacitor 130. The first capacitor 110 is connected to a power supply node of the voltage controlled oscillator 20. The voltage controlled oscillator 20 is operated in response to the clock signal input to the CK terminal 10.

When the clock signal is in the high state, the first capacitor 110 (Cr) controls a rising slope of a signal output from the voltage controlled oscillator 20. That is, when the clock signal enters the high state, the first capacitor 110 controls the rising slope in the process of turning on the voltage controlled oscillator 20 to increase the output signal.

Here, as a capacitance of the first capacitor 110 is increased, the rising slope is further gentle. The background thereof will be described below.

Figure 5:
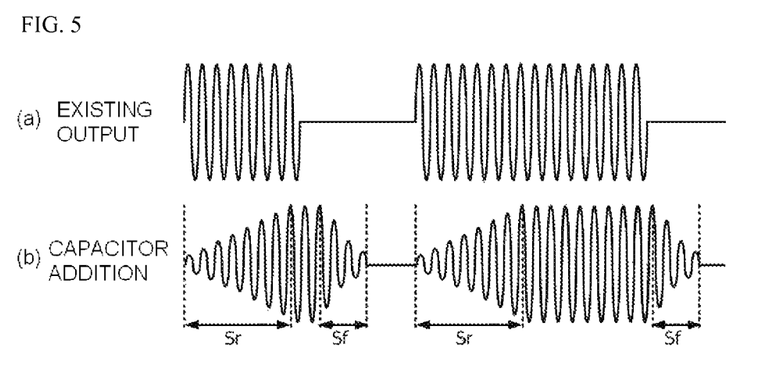
FIG. 5 illustrates output signals of a voltage controlled oscillator when only a first capacitor of first and second capacitors of FIG. 4 is presented.

FIG. 5 illustrates output signals of the voltage controlled oscillator when only the first capacitor of the first and second capacitors of FIG. 4 is presented. (a) of FIG. 5 illustrates an ideal signal waveform output from the voltage controlled oscillator 20 when pulse signals of 1, 0, 1, 1 and 0 are sequentially applied to the CK terminal 10, and (b) illustrates an actual signal waveform. A slope is not generated in the ideal output signal, but rising and falling slopes Sr and Sf are generated in the actually output signal.

Here, the first capacitor 110 reduces noise components from a DC power supplied from the voltage controlled oscillator 20 to increase an output and improve a phase noise characteristic. Meanwhile, the first capacitor changes the rising slope Sr so as to be gentler due to a time constant generated with a charging time of the capacitor. As a capacitance value becomes high, the rising slope Sr becomes relatively long. For this reason, it takes a long time to perform a stable operation for a maximum output. In constant, when the DC power is not applied, since the previously charged capacitor is discharged to maintain the circuit operation for a predetermined time, the falling slope Sf is generated.

However, in general, the rising and falling slopes Sr and Sf are not identical as illustrated in FIG. 5, and there is a deviation between them. Accordingly, quality of the system may be degraded.

In the exemplary embodiment of the present invention, the switching capacitor for controlling the rising and falling slopes Sr and Sf generated in the output signal to be equal is included. The switching capacitor includes the switch 120 and the second capacitor 130.

The switch 120 is connected to the first capacitor 110 in parallel, and receives a reverse signal of the clock signal through a CKB terminal 121, as a control signal. Accordingly, the switch 120 is turned on when the clock signal input to the CK terminal 10 is in the low state, and the switch is turned off when the clock signal is in the high state. The switch 120 may be implemented using a MOSFET device or a BJT device. At this time, a gate terminal of the MOSFET device or the BJT device is used as the terminal CKB to which the control signal is input.

The second capacitor 130 is connected to the switch 120 in series. Accordingly, when the switch 120 is turned on, the second capacitor 130 is connected to the first capacitor 110 in parallel, and when the switch is turned off, the second capacitor is disconnected from the first capacitor 110.

When the clock signal input to the CK terminal 10 is in the low state to turn on the switch 120, the second capacitor 130 controls the falling slope of the signal output from the voltage controlled oscillator 20. That is, the second capacitor 130 is not involved in the output signal when the clock signal is in the high state, and controls the falling slope in the process of turning off the voltage controlled oscillator 20 to cause the output signal to be zero when the clock signal enters the low state.

Figure 6:
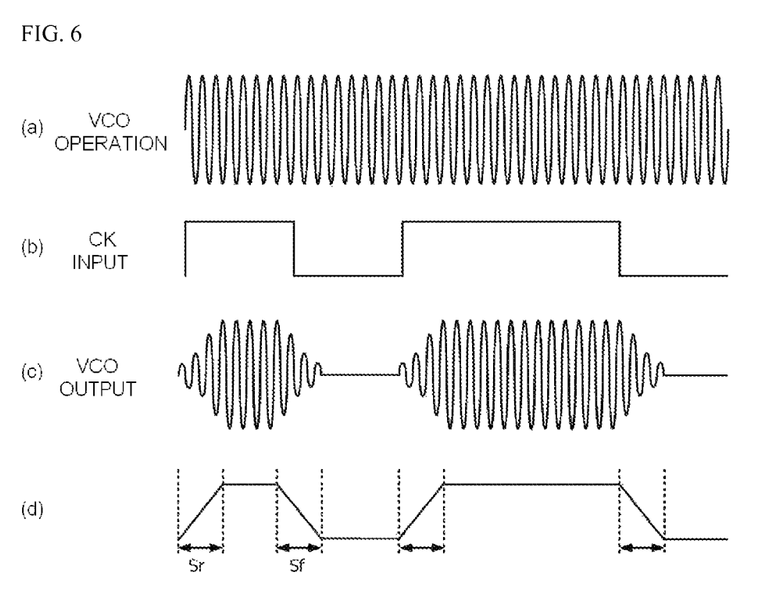
FIG. 6 illustrates output signals of the voltage controlled oscillator with the first and second capacitors of FIG. 4.

FIG. 6 illustrates output signals of the voltage controlled oscillator with the first and second capacitors of FIG. 4. (a) of FIG. 6 illustrates a basic output waveform of the voltage controlled oscillator 20 illustrated in FIG. 4, (b) illustrates a waveform of the clock signal input to the CK terminal 10, (c) illustrates an output waveform of the voltage control oscillator 20 when the clock signal is applied, and (d) illustrates edges of (c).

It can be seen from the result of FIG. 6 that when the switching capacitor is additionally used, the rising and falling slopes Sr and Sf can be controlled to be equal. In addition, the first capacitor 110 and the second capacitor 130 can additionally control a capacitance of the capacitor to allow the rising slope Sr and the falling slope Sf to be equal. In an exemplary embodiment thereof will be described below in detail.

According to the exemplary embodiment of the present invention, it is possible to control a time taken from changing of the clock signal to the high state to supply the power to the voltage controlled oscillator 20 to thereby stably operate the circuit and a time taken from changing the clock signal to the low state to shut off the power to thereby stop the operation of the circuit to be equal. According to this, as a result, an ideal operation of the target circuit, that is, the voltage controlled oscillator 20 can be performed, and it is possible to increase performance and reliability of the system.

Figure 7:
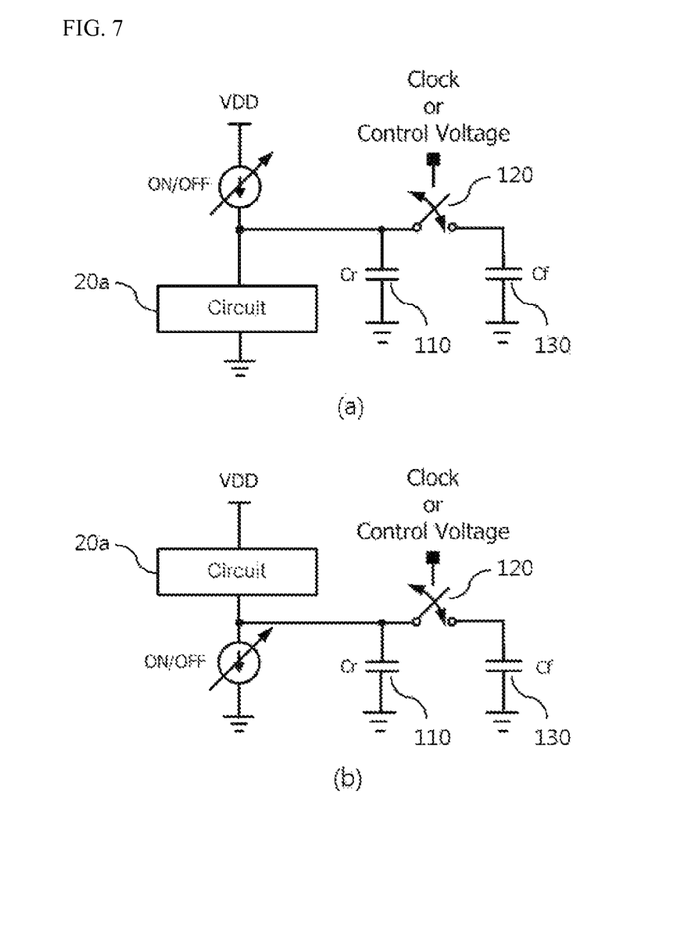
FIG. 7 is a generalized configuration diagram of the slew rate control device using a switching capacitor according to the exemplary embodiment of the present invention.

FIG. 7 is a generalized configuration diagram of the slew rate control device using a switching capacitor according to the exemplary embodiment of the present invention. (a) of FIG. 7 illustrates an example where a contact point of the first capacitor 110 and the switch 120 is connected to a power supply (a power supply node) of a target circuit 20a (for example, a voltage controlled oscillator), as in the exemplary embodiment of FIG. 4.

In the exemplary embodiment of the present invention, the contact point of the first capacitor 110 and the switch 120 may be connected to a ground (a ground node) of the target circuit 20a, as in (b) of FIG. 7. In (b) of FIG. 7, an appliance position of pulse signals may be connected to a ground terminal on the contrary to (a) of FIG. 7.

Figure 8:
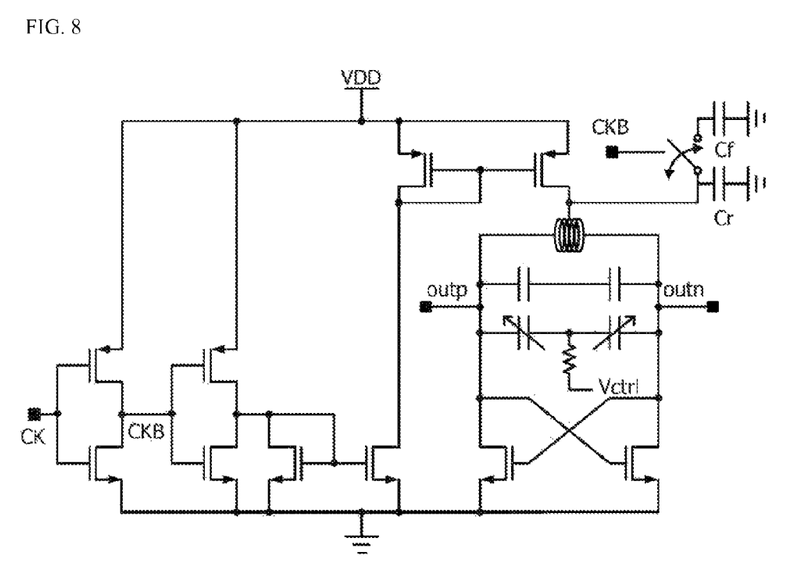
FIG. 8 is an exemplary diagram illustrating a case where a current mirror circuit and an inverter chain are added to the circuit of FIG. 4.

FIG. 8 is an exemplary diagram illustrating a case where a current mirror circuit and an inverter chain are added to the circuit of FIG. 4. In order to effectively transmit the pulse signals, the current mirror circuit may be additionally provided when necessary. At this time, it can be seen that the CKB terminal within the current mirror circuit is used as the CKB (Clock Bar) terminal of the switching capacitor.

Here, the number of gates through which a signal input to the CK terminal passes and the number of gates through which a CKB signal input to the switching capacitor passes are different from each other. In this case, a gate delay may be caused in a flow of the signal to adversely influence the circuit.

Figure 9:
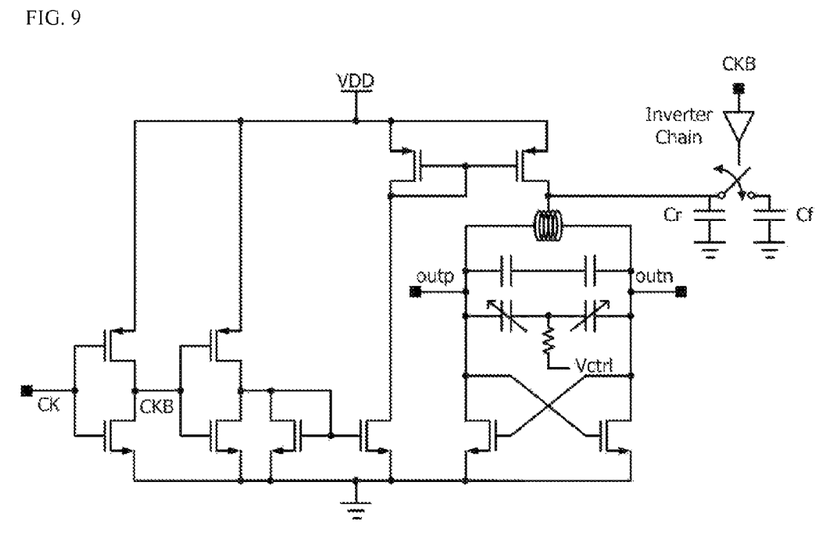
FIG. 9 illustrates a circuit where the inverter chain is added to the circuit of FIG. 8 in order to compensate for the gate delay.

Here, when the inverter chain is added to the CKB terminal of the switching capacitor, it is possible to control the gate delay. FIG. 9 illustrates a circuit where the inverter chain is added to the circuit of FIG. 8 in order to compensate for the gate delay. It is possible to control the number of gates for two paths by using the inverter chain to be equal, and it is possible to increase or decrease the gates if necessary.

Figure 10:
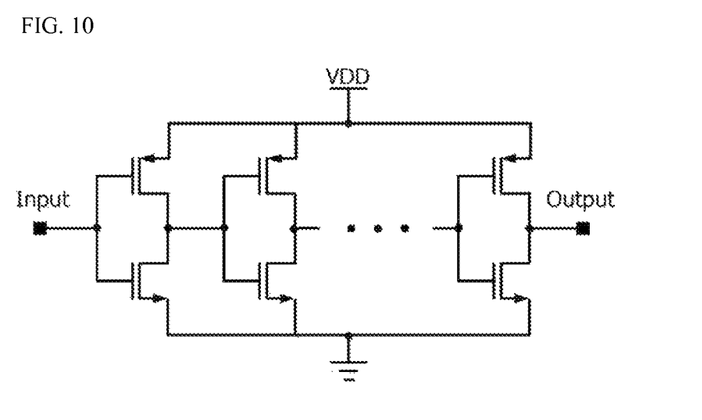
FIG. 10 is a configuration diagram of the inverter chain added to the circuit of FIG. 9.

FIG. 10 is a configuration diagram of the inverter chain added to the circuit of FIG. 9. The inverter chain is configured in such a manner that inverters including PMOSs and NMOSs are connected in parallel. When the number of the inverters is even within the inverter chain, an input and an output are the same, and when the number of the inverters is odd, a reverse input of the input is output as an output.

Figure 11:
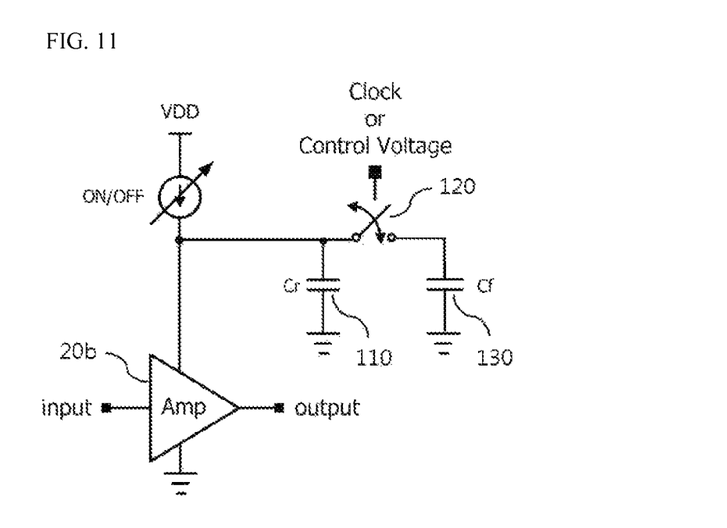
FIG. 11 is an exemplary diagram illustrating a case where the exemplary embodiment of the present invention is used at a power input terminal of an amplifier.

FIG. 11 is an exemplary diagram illustrating a case where the exemplary embodiment of the present invention is used at a power input terminal of an amplifier. Various amplifiers include a low-noise amplifier and a power amplifier. FIG. 11 illustrates an example where the configuration of the exemplary embodiment of the present invention is connected to a power supply node of an amplifier 20b. A structure of FIG. 11 may also be used at a ground node instead of the power supply node, as in FIG. 7.

Figure 12:
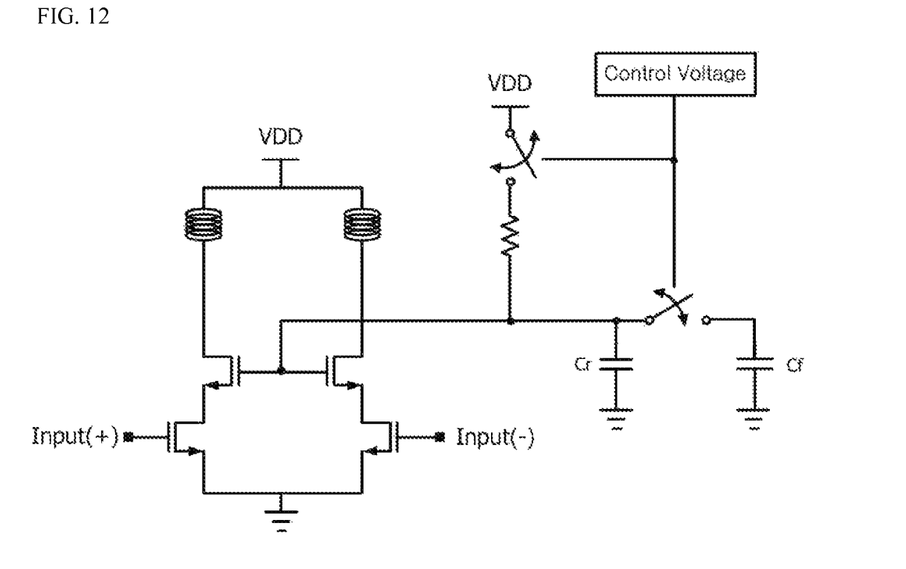
FIG. 12 is an exemplary diagram illustrating a case where the exemplary embodiment of the present invention is used at a common gate of a differential power amplifier.

FIG. 12 is an exemplary diagram illustrating a case where the exemplary embodiment of the present invention is used at a common gate of a differential power amplifier. A DC bias voltage is generally applied to a common gate of a power stage of the power amplifier. The present exemplary embodiment is applicable to the common gate, and, thus, it is possible to control a slew rate that may be generated in a structure requiring an operation for turning on or off the power stage.

Figure 13:
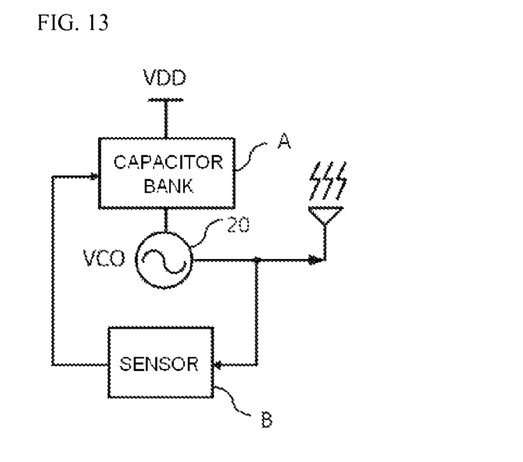
FIG. 13 is a conceptual diagram for describing a case where the capacitance of the capacitor is controlled using a sensor and a capacitor bank in the exemplary embodiment of the present invention.

Hereinafter, various exemplary embodiments where capacitances of the first and second capacitors are controlled will be described in detail. FIG. 13 is a conceptual diagram for describing a case where the capacitance of the capacitor are controlled using a sensor and a capacitor bank in the exemplary embodiment of the present invention.

In FIG. 13, a sensor B is connected to an output signal terminal (at least one of terminals outp and outn in FIG. 4) of the voltage controlled oscillator 20 to detect rising and falling slopes from an output signal. The sensor B determines the capacitance of the capacitor such that two detected slopes are equal, and transmits a digital signal corresponding to the determined capacitance to a capacitor bank A.

The capacitor bank A includes the first and second capacitors, and the capacitances of the first and second capacitors may be changed depending on the determined capacitance by the sensor B. Here, only the capacitance of one capacitor of the two capacitors may be changed, or the capacitances of the two capacitors may be changed.

The sensor B may be divided into two components including a sensing unit and a control unit. The sensing unit detects the rising and falling slopes from the signal output from the voltage controlled oscillator. The control unit determines the capacitance of the first or second capacitor by using information detected by the sensing unit, and sends a capacitance control signal (a digital code output) corresponding to the determined capacitance to the capacitor bank A.

Figure 14:
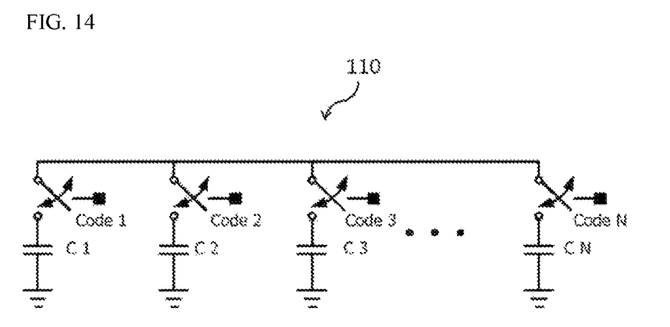
FIGS. 14 and 15 illustrate first and second implementation examples of the capacitor bank illustrated in FIG. 13.

FIG. 14 illustrates a first implementation example of the capacitor bank illustrated in FIG. 13. The first implementation example is an example where the first capacitor 110 and the second capacitor 130 are respectively formed as separate capacitor banks. Here, the capacitor banks are implemented for the two capacitors 110 and 130 by the same method. Hereinafter, the implementation example of the first capacitor 110 will be described.

Referring to FIG. 14, the first capacitor 110 is formed as the capacitor bank including a capacitor group configured in such a manner that a plurality of capacitors C1, C2, . . . , and CN having different capacitances is connected in parallel and a switch group configured in such a manner that a plurality of switches selectively switches one of the plurality of capacitors C1, C2, . . . , and CN in response to the capacitance control signals Code1, Code2, . . . , and CodeN.

That is, the plurality of switches are turned on or off such that only the capacitor of the plurality of capacitors C1, C2, . . . , and CN corresponding to the capacitance determined by the sensor B are connected to the circuit. For example, when the capacitor C2 corresponds to the determined capacitance, the control unit sends the capacitance control signal as Code1=0, Code2=1, . . . , and CodeN=0 to control such that only the switch corresponding to the C2 is turned on and the other switches are turned off. As mentioned above, it is possible to control the slew rate by selectively using the capacitors in response to the digital signal applied from the sensor B.

Figure 15:
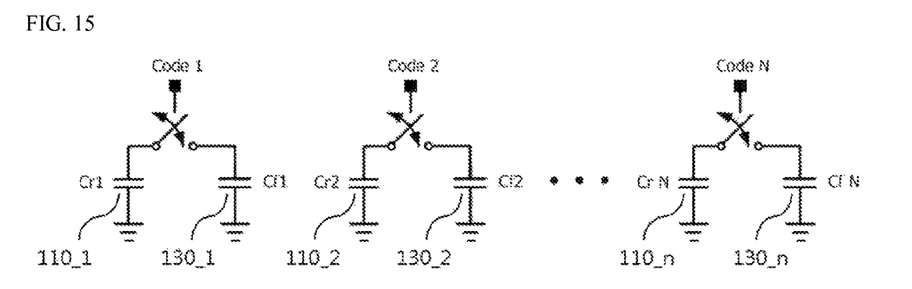

FIG. 15 illustrates a second implementation example of the capacitor bank illustrated in FIG. 13. The second implementation example is an example where the two capacitors 110 and 130 are paired and the paired capacitors are formed as the capacitor bank.

That is, in the second implementation example, the first and second capacitors are plural in number, the plurality of first and second capacitors are paired, and the plurality of paired first and second capacitors is formed as the capacitor bank. Referring to FIG. 15, the first capacitor 110_1 and the second capacitor 130_1 are paired, and the first capacitor 110_2 and the second capacitor 130_2 are paired. As a result, the capacitor bank including n numbers of pairs in total is formed. Here, the capacitors may have capacitances such that a capacitance ratio of the first pair (the first capacitor 110_1 and the second capacitor 130_1) is 1:9, a capacitance ratio of the second pair is 2:8, a capacitance ratio of the third pair is 3:7, and a capacitance ratio of the fourth pair is 4:6.

In FIG. 15, one pair of the plurality of pairs may be selectively used in response to the capacitance control signal sent from the sensor B. For example, when the capacitance control signal is received as Code1=0, Code2=1, . . . , and CodeN=0, it is possible to control the slew rate by using the Cr2 and Cf2 included in the second pair.

Figure 16:
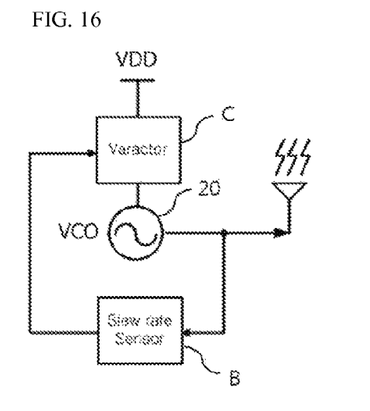
FIG. 16 illustrates an example where the capacitor bank of FIG. 13 is implemented using a varactor device which is a variable capacitor.
Figure 17:
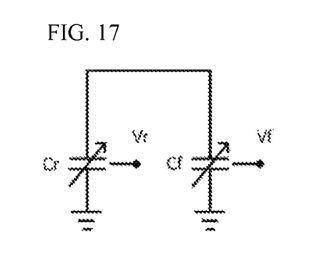
FIG. 17 illustrates an implementation example of the varactor of FIG. 16.

FIG. 16 illustrates an example where the capacitor bank of FIG. 13 is implemented using a varactor device which is a variable capacitor. In FIG. 16, the sensor B may determine the rising and falling slopes from the output signal of the voltage controlled oscillator 20, and send a DC voltage corresponding to a capacitor capacitance value for allowing two slopes to be equal as a bias voltage of the varactor C. The varactor C can control the slew rate by obtaining a desired capacitance value through the bias voltage received as an input. FIG. 17 illustrates an implementation example of the varactor of FIG. 16. It is possible to obtain desired rising and falling slopes by changing the bias voltages Vr and Vf of the varactors Cr and Cf by using the DC voltage output from the sensor B.

In accordance with the slew rate control device using a switching capacitor according to the present invention described above, it is possible to easily design the circuit without requiring an additional control circuit by simply adding the switching capacitor to the power supply node or the ground node of the target circuit to control the slew rate.

The present invention has been described in connection with the exemplary embodiments illustrated in the drawings, but the embodiments are merely examples. It will be apparent to those skilled in the art that various modifications and equivalents are possible. Therefore, the technical scope of the present invention should be decided by the appended claims.

What is claimed is:

1. A slew rate control device using a switching capacitor, the device comprising:
   a first capacitor that is connected to a target circuit operated in response to a clock signal, and controls a rising slope of a signal output from the target circuit when the clock signal is in a high state;
   a switch that is connected to the first capacitor in parallel, receives a reverse signal of the clock signal, as a control signal, and is turned on when the clock signal is in a low state; and
   a second capacitor that is connected to the switch in series, and controls a falling slope of the signal output from the target circuit when the clock signal is in the low state.

2. The slew rate control device using a switching capacitor of claim 1, wherein a contact point of the first capacitor and the switch is connected to a power supply or a ground of the target circuit.

3. The slew rate control device using a switching capacitor of claim 2, wherein the target circuit is a voltage controlled oscillator or an amplifier.

4. The slew rate control device using a switching capacitor of claim 1, wherein capacitances of the first and second capacitors are controlled such that the rising slope and the falling slope are equal.

5. The slew rate control device using a switching capacitor of claim 4, further comprising:
   a sensing unit that detects the rising and falling slopes from the signal output from the target circuit; and
   a control unit that determines the capacitance of the first or second capacitor by using information detected by the sensing unit, and sends a capacitance control signal corresponding to the determined capacitance to the first or second capacitor.

6. The slew rate control device using a switching capacitor of claim 5, wherein the first and second capacitors are a variable capacitor including a varactor device.

7. The slew rate control device using a switching capacitor of claim 5, wherein the first and second capacitors are respectively formed as capacitor banks including each including a capacitor group configured in such a manner that a plurality of capacitors having different capacitances is connected in parallel and a switch group configured in such a manner that a plurality of switches selectively switches one of the plurality of capacitors in response to the capacitance control signal.

8. The slew rate control device using a switching capacitor of claim 5,
   wherein the first and second capacitors are plural in number,
   the plurality of first and second capacitors are paired with each other, and
   the plurality of paired first and second capacitors is formed as a capacitor bank configured in such a manner that one pair of the plurality of pairs is selectively used in response to the capacitance control signal.

\* \* \* \* \*